Nov. 22, 1960 H. M. CLEVELAND 2,961,354
SURFACE TREATMENT OF SEMICONDUCTIVE DEVICES
Filed Oct. 28, 1958
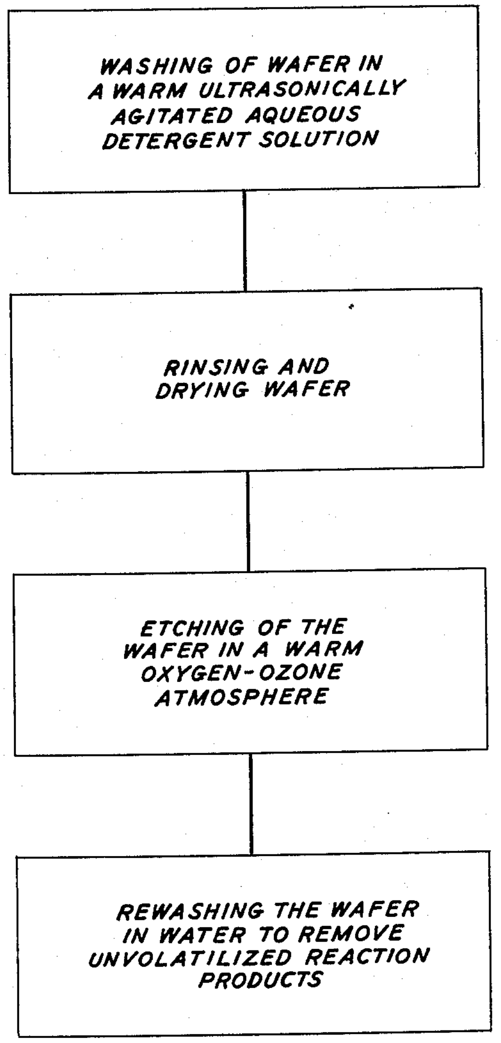
INVENTOR
H. M. CLEVELAND
BY
Arthur J. Torsiglieri
ATTORNEY United States Patent Office 2,961,354

Patented Nov. 22, 1960

2,961,354

SURFACE TREATMENT OF SEMICONDUCTIVE DEVICES

Hugh M. Cleveland, Chatham Township, Morris County, N.J., assignor to Bell Telephone Laboratories, Incorporated, New York, N.Y., a corporation of New York Filed Oct. 28, 1958, Ser. No. 770,212

6 Claims. (Cl. 134—1)

This invention relates to the fabrication of semiconductive devices and more particularly relates to treatments for stabilizing the properties of semiconductive devices.

In order to provide long term stability to a semiconductive device, it is advantageous to clean the surface of the semiconductive wafer, which is the active element in such a device, before encapsulation of the wafer in its housing. Treatments are known which ordinarily are quite satisfactory for this purpose. Generally, the treatments include etching in an aqueous etchant to remove the surface contaminants.

Such treatments are not especially suited, however, for use with wafers of the kind which cannot tolerate any significant surface etching because of the effect of such etching on the electrical properties. Typical of such a wafer is one employed in a diffused-base transistor designed for use at high frequencies in which the base zone has been formed by the diffusion of an impurity into a surface region thereof and the emitter zone has been formed by the reconversion of a surface portion of this region. In such a transistor, the base zone is typically a small fraction of a mil thick and the emitter zone is still thinner and, accordingly, any significant etching of the corresponding surface has a noticeable effect on the electrical properties.

An object of the present invention is a treatment for cleaning semiconductive wafers whose surfaces are best not subjected to any significant amount of etching.

The cleaning treatment in accordance with the invention in its preferred embodiment comprises three basic steps each of which plays an important and distinct role to the end that a high degree of cleaning is achieved without significant etching.

First, the wafer is washed in a warm ultrasonically agitated aqueous detergent solution for a time sufficient to remove from the surface substantially all physical contaminants, such as dust and other discrete particles, which are not attached to the surface by direct chemical bonds. Such initial removal of the physical contaminants facilitates the subsequent removal of chemically bound contaminants.

Next, the wafer is maintained in a warm ozone-oxygen atmosphere for a time sufficient to oxidize a few molecular layers of the surface of the element. Such an atmosphere effectively serves as a very mild etchant, since it neutralizes or removes from an active role the affected molecular layers, although such layers are not necessarily physically removed to constitute etching in the sense that the term is used herein. Moreover, this etching treatment is particularly efficacious for removing chemisorbed hydrophobic contaminants which tend to be little affected by aqueous etching solutions so that such contaminants can be effectively removed without undue etching of the semiconductive substrate.

Finally, as the last step of the process, the wafer is washed in ultra-pure deionized water to remove the water-soluble residues remaining on the surface. Advantageously, the washing is done in a system which provides for the recovery, purification and reuse of the deionized water. With such a system the conductivity of the water is monitored and the washing is continued at least until the conductivity of the water is no longer affected by the presence of the wafer.

The drawing is a flow chart of the basic steps of the preferred form of the invention.

In one specific application, the invention was employed to clean the surface of the germanium wafer in a diffused base transistor of the kind which is described in copending application Serial No. 496,202, filed March 23, 1955 (Dacey-Lee-Shockley Case 3-1-50) and owned by the present assignee. Such a germanium wafer is characterized by an exposed base zone which is a fraction of a mil thick and has been formed by the solid-vapor diffusion of arsenic and an exposed emitter zone which is an even smaller fraction of a mil thick and has been formed by alloyage of a thin aluminum film. Electrode connections are thereafter provided to each of the emitter, base and collector zones. In cleaning such a wafer preparatory to its encapsulation, it is advantageous to avoid any significant etching of the surfaces of the base and emitter zones.

As a first step, the germanium wafer was washed to remove from its surfaces physical contaminants of the kind which consist of finely divided particles not soluble in either water or organic solvents and not firmly attached to the surface by direct chemical bonds. To remove such contaminants it is necessary to provide sufficient mechanical thermal energy to the substrate-contaminant system to overcome the forces of adhesion. To this end, the wafer was immersed for several minutes in a warm aqueous detergent solution which was ultrasonically agitated. The detergent in the solution reduces the energy requirements by increasing wetting and solubilization and reducing adhesion. The heating and ultrasonic agitation are useful to supply energy for displacing the contaminants physically from the substrate once they have been wet and partially solubilized and for dispersing them in the liquid. The presence of the detergent additionally facilitates such dispersion.

Redeposition of the contaminants from the bath on the wafer is minimized by removing the dispersed material from the environment of the wafer by providing unidirectional and continuous flow past the wafer.

A bath found suitable comprised deionized water to which had been added .05 percent Igepal, a synthetic detergent in common use. A bath temperature of 50 degrees centigrade proved convenient. Conventional ultrasonic washing apparatus was employed. The specific details of the washing operation ordinarily may be varied considerably but it is important to provide sufficient washing to remove substantially all the physical contaminants of the kind described, and this is best achieved with a warm aqueous detergent bath which is ultrasonically agitated.

It is important that this first step do as thorough a job as possible to reduce the amount of etching that will be required.

After the wafer was adequately washed in the detergent solution, it was rinsed in clean deionized water and dried.

Thereafter, the wafer was subjected to a warm oxygen-ozone atmosphere to remove the remaining contaminants bound to the wafer substrate by chemical bonds. In particular, it was found convenient to position the wafer in an oven which was kept at 145 degrees centigrade and to flow therepast for about three-quarters of an hour a mixture of approximately 98 percent oxygen and 2 percent ozone. The action is often adequate when it has progressed to the point of oxidizing several molecular layers of the surface of the wafer, a distance of about 50 Angstroms. However, to provide a margin of safety, it is found preferable to oxidize a layer of at least 100 Angstroms thickness. The upper limit is determined by how much etching is tolerable before the electrical properties are significantly disturbed. In some instances, only 200 Angstroms may be safely oxidized, while in others several thousand Angstroms may be oxidized. Ordinarily, it is of little avail to increased cleanliness to prolong the etching beyond the point at which there is oxidized a thickness of 1,000 Angstroms of the semiconductor. It can be appreciated that the specific conditions under which the etching may be carried out successfully are to a considerable extent variable. However, it is undesirable to utilize too slow an etching rate since then inconveniently long times are required to achieve the desired amount of etching. Conversely, if too fast an etching rate is used, there results a loss both in control and in the selectivity which the etching action exhibits to contaminants over the semiconductor proper. It is ordinarily advantageous to adjust the etching rate so that the desired etching is realized in a time between ten minutes and an hour. More particularly, it is found preferable if the etching rate is such that the required time is between one-half and three-quarters of an hour. In order to affect to a minimum extent both the electrical properties of the wafer and the various connections thereto, this cleaning treatment preferably is carried out at temperatures below 200 degrees centigrade. Similarly, to expedite the treatment while avoiding the necessity for inconveniently high ozone concentrations, the temperature should be above 100 degrees centigrade. In this preferred temperature range, ozone concentrations between 1 percent and 3 percent will produce satisfactory etching rates. Conventional ozone-forming equipment available commercially may be employed to form the oxygen-ozone mixture employed as the etchant.

Upon completion of the etching operation, the wafer was rewashed in pure water to remove any contaminating reaction products which had not completely volatilized. A washing treatment found advantageous included immersing the wafer in a circulating water system, monitoring the conductivity of the water as it left the vicinity of the wafer, and discontinuing the washing only after the conductivity of the water which had flowed past the wafer was substantially the same as that of the water arriving in the vicinity of the wafer. It is preferable to utilize water having initially a conductivity of the order of less than 0.1 micromho. Conventional ion exchange columns commercially available may be used to purify the water after its flow past the wafer.

The water wash described is useful not only for cleaning but also for helping neutralize the effect of the ozone treatment on the electrical properties of the surface. In particular, the ozone treatment serves to induce acceptor states on the surface of the wafer and the water wash tends to counteract this effect.

After the washing treatment was complete, times between ten and thirty minutes typically were adequate, the wafer was dried. At this point, the wafer was ready for encapsulation in the usual manner.

It should be clear that the treatment described is capable of wide use in the processing of semiconductive devices. In particular, its principles are applicable to use with wafers of other semiconductive materials, such as silicon, silicon-germanium alloys and intermetallic semiconductive compounds.

What is claimed is:

1. The process of cleaning before encapsulation a semiconductive wafer in which there has previously been formed rectifying junctions comprising the steps of first washing the wafer in a warm ultrasonically agitated aqueous detergent solution for a time sufficient to remove from the surface of the wafer substantially all physical contaminants unattached thereto by direct chemical bonds, rinsing in water, subjecting the wafer to a warm oxygen-ozone atmosphere for a time sufficient to oxidize at least the outer 50 Angstroms of the semiconductor surface, and rewashing the wafer in water to remove unvolatilized reaction products.

2. The process of cleaning before encapsulation a germanium wafer in which there has previously been formed rectifying junctions which includes the step of maintaining the wafer in a oxygen-ozone atmosphere at between 100° C. and 200° C. for a time sufficient to oxidize at least the outer 50 Angstroms of the wafer surface.

3. The process of cleaning before encapsulation a semiconductive wafer in which there has previously been formed rectifying junctions which includes the steps of washing the wafer in a warm ultrasonically agitated aqueous detergent solution and thereafter maintaining the wafer in a warm oxygen-ozone atmosphere for a time sufficient to oxidize at least the outer 50 Angstroms of the wafer surface.

4. The process of claim 2 which also includes the step of washing the wafer in deionized water after its exposure to the oxygen-zone atmosphere to remove unvolatilized reaction products.

5. The process for cleaning before encapsulation a germanium wafer in which there has previously been provided rectifying junctions comprising the steps of washing the wafer in a warm ultrasonically agitated aqueous detergent solution for a time sufficient to remove from its surface substantially all physical contaminants not chemically bound thereto, rinsing in water, subjecting the wafer to a warm oxygen-ozone atmosphere for a time sufficient to oxidize at least the outer 50 Angstroms of its surface, and rewashing the wafer in water to remove unvolatilized reaction products and to neutralize the effect of the ozone on the surface properties of the wafer.

6. The process of cleaning before encapsulation a germanium wafer in which has previously been provided rectifying junctions comprising the steps of washing the wafer in a warm ultrasonically agitated aqueous detergent solution, rinsing in water, subjecting the wafer for between ten minutes and an hour at a temperature between 100 degrees centigrade and 200 degrees centigrade to an oxygen-ozone atmosphere which includes between one and three parts per hundred ozone, and thereafter washing the wafer in water to remove unvolatilized reaction products.

References Cited in the file of this patent

UNITED STATES PATENTS

| | | |
|---|---|---|
| 2,633,437 | Detjen | Mar. 31, 1953 |
| 2,899,344 | Atalla | Aug. 11, 1959 |

OTHER REFERENCES

Mellor: Comprehensive Treatise on Inorganic and Theoretical Chemistry, vol. I, pages 906 and 908. Longmans, Green & Co., New York, 1922.